United States Patent
Naem

(10) Patent No.: US 6,608,349 B1
(45) Date of Patent: Aug. 19, 2003

(54) NARROW/SHORT HIGH PERFORMANCE MOSFET DEVICE DESIGN

(75) Inventor: Abdalla Naem, Overiise (BE)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/054,317

(22) Filed: Nov. 13, 2001

(51) Int. Cl.$^7$ .................... H01L 29/76; H01L 29/94; H01L 31/062; H01L 31/113; H01L 31/119
(52) U.S. Cl. ................................. 257/327; 257/202
(58) Field of Search ................. 257/202, 327–346

(56) References Cited

U.S. PATENT DOCUMENTS

| | | | | |
|---|---|---|---|---|
| 4,586,240 A | * | 5/1986 | Blackstone et al. | 29/571 |
| 5,565,375 A | * | 10/1996 | Hiser et al. | 437/57 |
| 6,078,082 A | * | 6/2000 | Bulucea | 257/345 |
| 6,114,726 A | * | 9/2000 | Barkhordarian | 257/341 |
| 6,127,700 A | * | 10/2000 | Bulucea | 257/335 |
| 6,198,126 B1 | * | 3/2001 | Mori et al. | 257/328 |

OTHER PUBLICATIONS

A.A. Naem et al., Compensation Tendency of Short–Channel and Narrow–Channel Effects in Small–Geometry IGFETs,: *Electronics Letters*, Feb. 4, 1982, vol. 18, No. 3, pp. 135–136.

H.S. Lee, "An Analysis of the Threshold Voltage for Short–Channel IGFET's," *Solid–State Electronics*, 1973, vol. 16, pp. 1407–1417.

* cited by examiner

Primary Examiner—Amir Zarabian
Assistant Examiner—Monica Lewis
(74) Attorney, Agent, or Firm—Stallman & Pollock LLP

(57) ABSTRACT

A short/narrow high performance MOSFET structure in accordance is formed in a semiconductor substrate having a first conductivity type. A first linear sequence of diffusion regions having a second conductivity type is formed in the semiconductor substrate. Each diffuision region in the first sequence is spaced-apart from the prior diffusion region in the first sequence to define a substrate channel region between adjacent diffusion regions. A second linear sequence of diffusion regions having the second conductivity type is also formed in the substrate. As in the case of the first linear sequence, each diffusion region in the second sequence is spaced-apart from the prior diffusion region in the sequence to define s substrate channel region between adjacent diffusion regions in the sequence. Dielectric material is formed in the substrate between the first and second diffusion region sequences to provide electrical isolation between the two sequences. Each substrate channel region in the first sequence corresponds to a substrate channel region in the second sequence to define channel region pairs. A conductive gate electrode is provided that includes gate electrode fingers connected to a common gate electrode portion. Each of the gate electrode fingers extends over an associated channel region pair and is separated therefrom by intervening dielectric material. The diffusion regions in the first and second linear sequences are alternately connected to the source and drain electrodes of the device, resulting in short/narrow gate cells that are connected both in parallel and in series, thereby increasing the device current derive.

3 Claims, 3 Drawing Sheets

NARROW/SHORT HIGH PERFORMANCE MOSFET DEVICE DESIGN

BACKGROUND OF THE INVENTION

1. Field of the Invention

The present invention relates to semiconductor integrated circuit structures and, in particular, to a novel MOSFET gate design that includes short/narrow gate cells that are connected both in parallel and in series in order to increase the device current derive, while maintaining the overall device performance characteristics of larger geometry devices, and while minimizing short channel effects (SCE) and narrow channel effects (NCE).

2. Discussion of the Related Art

It has been shown that MOSFET transistors show degraded performance due to enhanced short channel effects (SCE) as the transistors are made shorter. For example, the threshold voltage of an N-channel MOSFET transistor gets smaller as the channel length of the transistor is made shorter. In general, the overall performance characteristics of a MOSFET device become impaired as a result of severe short channel effects if the device is made shorter than that provided by currently available technology.

The channel width of a MOSFET device has a similar effect on the transistor characteristics, but in the opposite sense. That is, the threshold voltage of an N-channel MOSFET transistor becomes larger when the channel width is made narrower.

H.S. Lee, "An Analysis of the Threshold Voltage for Short Channel IGFETs", *Solid State Electronics*, 1973, vol. 15, pgs. 1407–1417, teaches that when the MOSFET transistor channel gate is made short as well as narrow, the two threshold voltage shift effects, i.e. SCE and NCE, have a compensating tendency. Also, the threshold voltage of such a short/narrow device can actually improve and may approach that of a larger geometry device.

SUMMARY OF THE INVENTION

The present invention provides a novel MOSFET gate design. The new gate design includes short/narrow gate cells that are connected in parallel and in series in order to increase the device current derive. The overall device performance characteristics look like those of a larger geometry device, with minimal short channel effects and narrow channel effects.

More specifically, a short/narrow high performance MOS transistor structure in accordance with the present invention includes a semiconductor substrate well having a first conductivity type. The substrate well is surrounded by shallow trench isolation (STI), typically silicon dioxide. A first linear sequence of diffusion regions having a second conductivity type is formed in the semiconductor substrate. Each diffusion region in the first sequence is spaced-apart from a prior diffusion region in the first sequence to define a substrate channel region between adjacent diffusion regions. A second linear sequence of diffusion regions having, a second conductivity is also formed in the semiconductor substrate. As in the case of the first linear sequence, each diffusion region in the second sequence is spaced-apart from a prior diffusion region in the second sequence to define a substrate channel region therebetween. A region of shallow trench isolation dielectric material is formed in the semiconductor substrate between the first linear sequence and its associated substrate channel regions and the second sequence of diffusion regions and its associated substrate channel regions. The region of dielectric material provides electrical isolation between the first and second linear diffusion region sequences. Each substrate channel region of the first linear sequence corresponds to a substrate channel region of the second linear sequence to define a plurality of channel region pairs. In further accordance with the invention, a conductive gate electrode is provided that includes a plurality of spaced-apart gate electrode fingers. Each of the gate electrode fingers is connected to a common gate electrode portion. Each of the gate electrode fingers extends over an associated channel region pair and is separated therefrom by intervening dielectric material. The diffusion regions in the first and second linear diffusion region sequences are alternately connected to the source and drain electrodes of the device, resulting in short/narrow gate cells that are connected both in parallel and in series, thereby increasing the device current derive while maintaining well controlled device characteristics.

Further features and advantages of the present invention will become apparent from the following detailed description and accompanying drawings that set forth an illustrated embodiment in which the principals of the invention are utilized.

DETAILED DESCRIPTION

Figure 1:
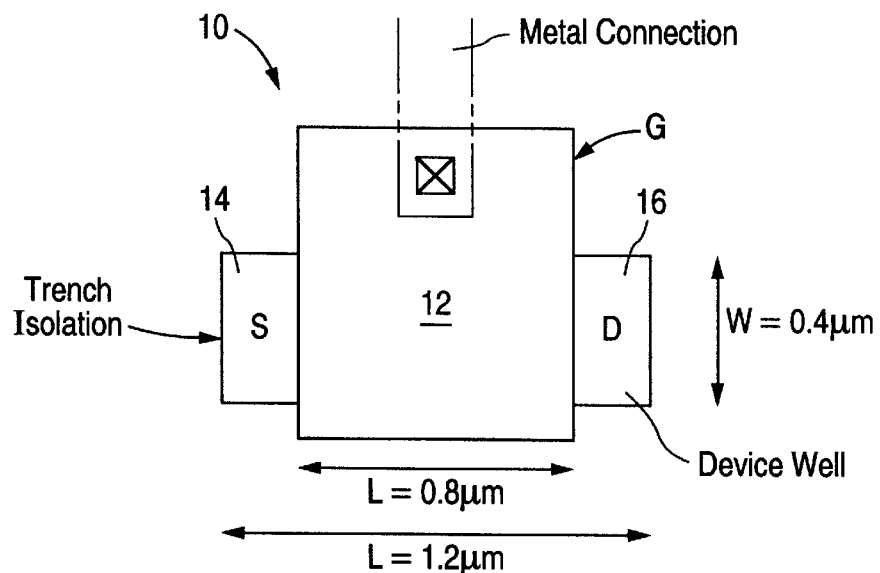
FIG. 1 is a plan view illustrating a conventional MOSFET device design having the same channel area as a design in accordance with the present invention (FIG. 3).

FIG. 1 shows a conventional MOSFET device design structure 10 that includes a gate electrode 12, a device well that includes a source region 14 and a drain region 16. The device well is surrounded by shallow trench isolation (STI) in the conventional manner. A metal connection to the gate electrode 12 is shown in phantom lines. Those skilled in the art will appreciate that a substrate channel region underlies the gate electrode 12 and that gate dielectric material separates the gate 12 from the substrate channel region. As discussed in greater detail below, the MOSFET structure 10 has the same channel area as a MOSFET design structure in accordance with the present invention (shown in FIG. 3). However, the conventional device 10 illustrated in FIG. 1 will have much less current derive (w/L=0.4/0.8=0.5) compared to the FIG. 3 device. The total device well area in the FIG. 1 design is 0.4×1.2 um=0.48 um2, while that in the FIG. 3 design is 0.6×1.8=1.08 um2.

Figure 2:
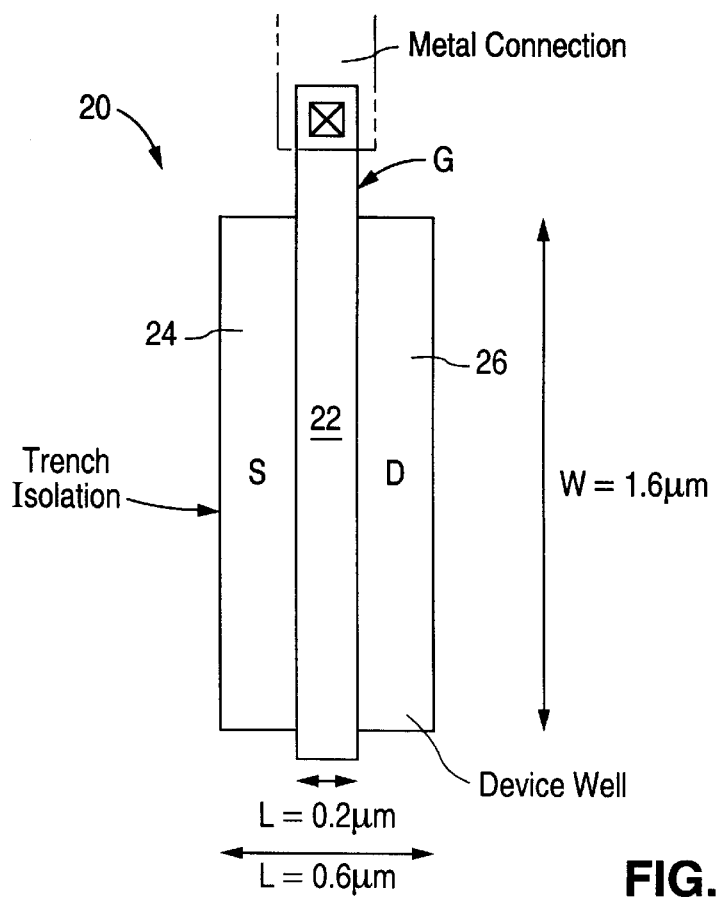
FIG. 2 is a plan view illustrating a conventional MOSFET design having the same width/length (w/L) ration as a design structure in accordance with the present invention (FIG. 3).

FIG. 2 shows another conventional MOSFET design structure 20 having gate electrode 22, source region 24 and drain region 26. The MOSFET device 20 has the same width/length ratio w/L=1.6/0.2=8 as a design in accordance with the present invention (shown in FIG. 3). While the device 20 shown in FIG. 2 will have approximately the same current derive (w/L=8) as the FIG. 3 design, the device characteristics of the FIG. 2 design will be dominated by short channel effects (SCE) that could render the device unusable unless additional expensive process optimization steps are introduced. The total device well for the FIG. 2 design is 0.6×1.6 um=0.96 um2, which is slightly smaller than that of the FIG. 3 design of 0.6×1.8=1.08 um2.

Figure 3:
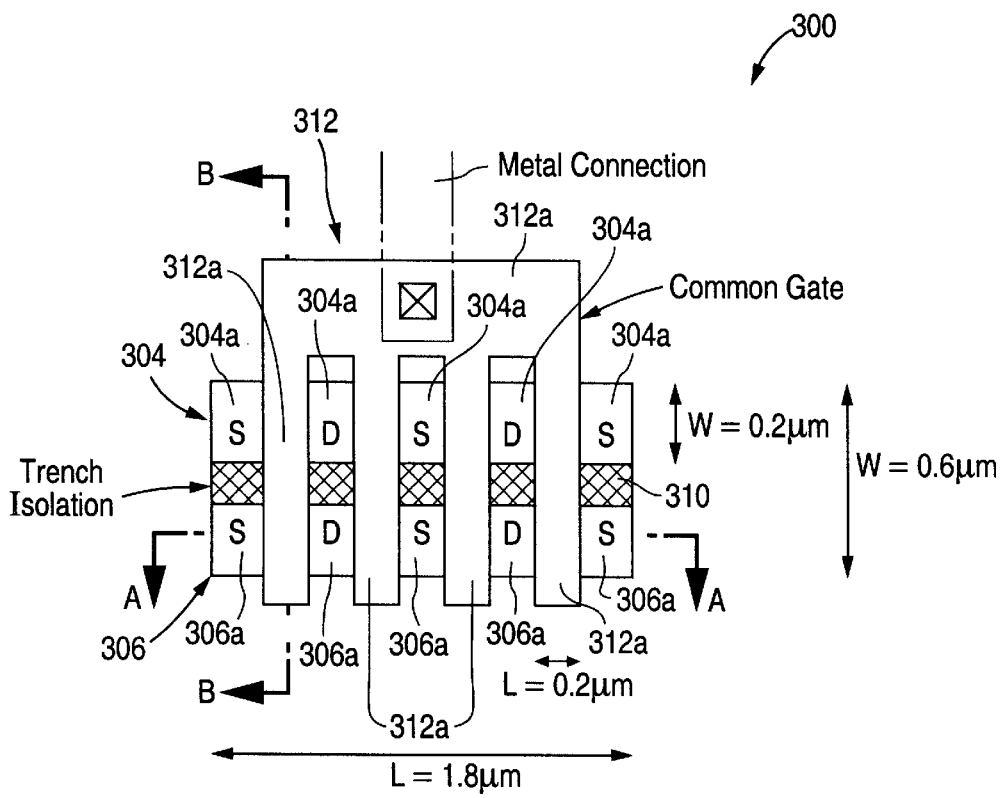
FIG. 3 is a plan view illustrating a MOSFET device design in accordance with the present invention.

FIG. 3 shows a short/narrow MOSFET device structure 300 in accordance with the present invention. The MOSFET device 300 has the same effective channel area as the conventional device design 20 shown in FIG. 2. However, the FIG. 3 device has much more controllable drain current-voltage characteristics (8×w/L=0.2/0.2=8 times). Also, the total device well for the FIG. 3 design is 0.6×1.8=1.08 um2, which is slightly larger than that of the FIG. 2 design (0.96 um2).

Figure 4:
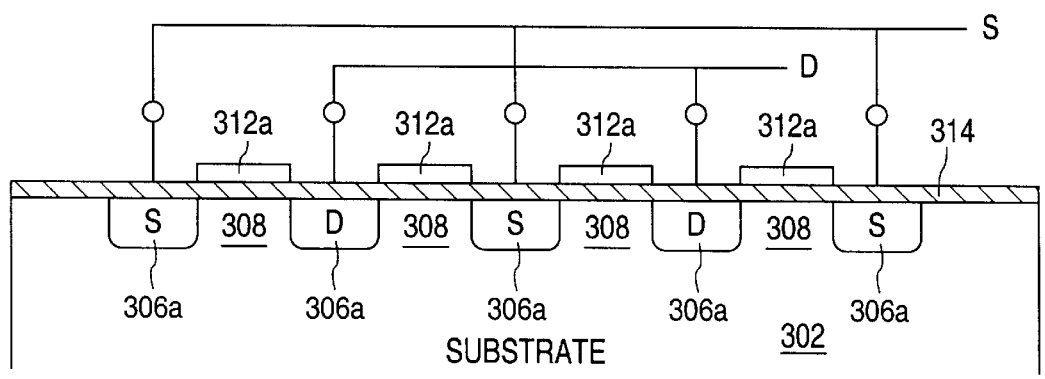
FIG. 4 is a partial cross-section view taken along line A—A in FIG. 3.
Figure 5:
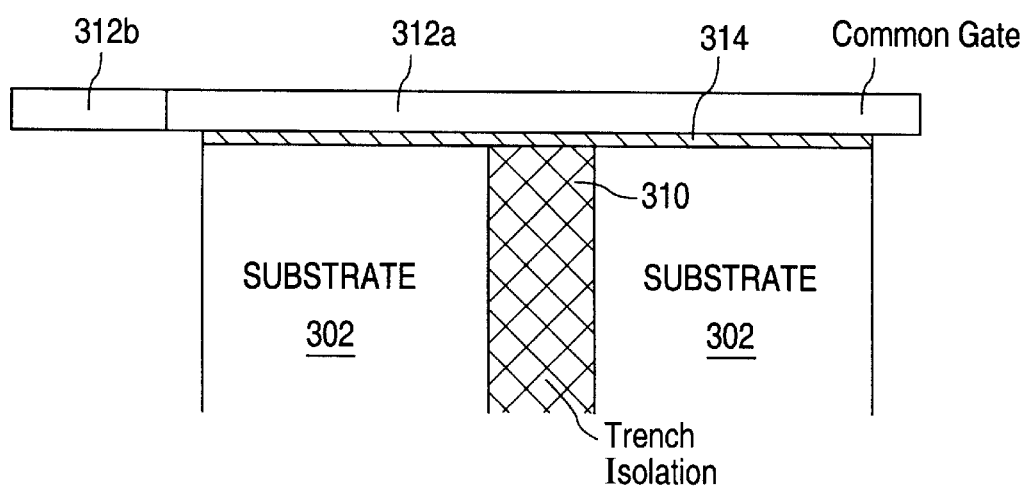
FIG. 5 is a cross-sectional view taken along line B—B in FIG. 3.

FIG. 4 shows a cross-section of the FIG. 3 device structure 300 taken along line A—A in FIG. 3. FIG. 5 shows a cross-section of the FIG. 3 device structure 300 taken along line B—B in FIG. 3.

Referring to FIGS. 3–5, a narrow-short high performance transistor structure 300 in accordance with the present invention is formed in a semiconductor substrate well 302, typically silicon, having a first conductivity type. A first linear sequence 304 of a plurality of diffusion regions 304a having a second conductivity type opposite the first conductivity type is formed in the semiconductor substrate 302. Each diffusion region 304a in the first sequence 304 is spaced-apart from a prior diffusion region 304a in the sequence 304, thereby defining a substrate channel region having the first conductivity type between adjacent diffusion regions 304a.

Similarly, a second linear sequence 306 of a plurality of diffusion regions 306a having the second conductivity type is also formed in the semiconductor substrate 302. As best shown in FIG. 4, and as in the case of the first sequence 304 of diffusion regions 304a, each diffusion region 306a in the second sequence 306 is spaced-apart from a prior diffusion region in the second sequence to define a substrate channel region 308 having the first conductivity type therebetween.

As shown in FIGS. 3 and 5, a region 310 of STI dielectric material, typically silicon dioxide in the case of a silicon substrate, is formed in the semiconductor substrate 302 between the first linear sequence 304 of diffusion regions and its associated substrate channel regions and the second linear sequence 306 of diffusion region and its associated substrate channel regions. The region 310 of dielectric material provides electrical isolation between the first and second linear sequences. As illustrated in FIG. 4, the diffusion regions in the first and second linear sequences are alternately connected to source (S) and drain (D) electrodes of the device 300.

As shown in FIG. 3 each substrate channel region of the first linear sequence corresponds to a substrate channel region of the second linear sequence to define a plurality of channel region pairs.

A conductive gate electrode 312 is provided that includes a plurality of spaced-apart gate electrode fingers 312a connected to a common gate electrode portion 312b. Each of the gate electrode fingers 312a extends over an associated channel region pair and is separated from the channel region pair by intervening gate dielectric material 314, as best shown in FIG. 4. The gate dielectric material 314 is typically silicon dioxide in the case of a silicon substrate 302.

Thus, the present invention provides a short/narrow high performance MOSFET device design (FIG. 3) that, in comparison with conventional device designs (FIG. 1), has the same channel area, provides similar or higher current derive, significantly reduces both short channel effects and narrow channel effects in the overall device performance, and saves additional expensive processing steps which would be required to minimize short channel effects or narrow channel effects in conventional device designs.

Those skilled in the art will appreciate that the structure of the short/narrow high performance MOSFET device design provided by the present invention can be fabricated utilizing conventional integrated circuit manufacturing techniques. For example, the fabrication process could proceed as follows: First, shallow trench isolation (STI) oxide is formed in a silicon substrate to define a device well that is surrounded by STI and is also bisected by STI region 310. A layer of gate oxide is then formed over the well and layer of polysilicon is formed over the gate oxide. A patterned photoresist mask is then formed on the polysilicon and utilized to etch the polysilicon layer to define the polysilicon conductive gate electrode 312. The poly etch can be designed to stop on the gate oxide to protect the underlying substrate well material, or optionally, as shown in FIGS. 3–5, be designed to etch through the gate oxide as well. Following the poly etch, the conductive gate electrode structure 312 is utilized in a self-aligned ion implantation step to introduce dopant of the second conductivity into the well region to define the source and drain regions of the MOSFET device; the poly gate electrode 312 is simultaneously doped to the desired conductivity level. Although these conventional fabrication steps, considered individually, are not considered to be part of the invention, the process module resulting in the novel device structure of the present invention is considered to be within the scope of the present invention.

It should be understood that various alternatives to the embodiments of the invention described above can be employed in practicing the invention. It is intended that the following claims define the scope of the invention and that methods and structures within the scope of these claims and their equivalents be covered thereby.

What is claimed is:

1. A high performance MOSFET transistor structure comprising:

a semiconductor substrate having a first conductivity type;

a first linear sequence of a plurality of diffusion regions having a second conductivity type that is opposite the first conductivity type formed in the semiconductor substrate, each diffusion region in the first linear sequence being spaced-apart from a prior diffusion region in the first linear sequence to define a substrate channel region having the first conductivity type therebetween;

a second linear sequence of a plurality of diffusion regions having the second conductivity type formed in the semiconductor substrate, each diffusion region in the second linear sequence being spaced-apart from a prior diffusion region in the second linear sequence to define a substrate channel region having the first conductivity type therebetween;

an intermediate region of dielectric material formed in the semiconductor substrate between the first linear sequence of diffusion regions and associated substrate channel regions and the second linear sequence of diffusion region and associated substrate channel regions to provide electrical isolation between the first linear sequence of diffusion regions and the second linear sequence of diffusion regions, each substrate channel region of the first linear sequence of diffusion regions corresponding to a substrate channel region of the second linear sequence of diffusion regions to define a plurality of substrate channel region pairs; and a conductive gate electrode that includes a plurality of spaced-apart gate electrode fingers, each of the gate electrode fingers being connected to a common gate electrode portion and each of the gate electrode fingers extending over an associated substrate channel region pair and over the intermediate region of dielectric material and separated from said associated substrate channel region pair by intervening gate dielectric material; and wherein the diffusion regions in the first linear sequence of diffusion regions and the diffusion regions in the second linear sequence of diffusion regions are alternately connected to a source electrode and to a drain electrode to define first and second alternating linear sequences of source regions and drain regions such that the source regions are electrically connected in parallel and the drain regions are electrically connected in parallel.

2. A high performance MOSFET transistor structure comprising:

a semiconductor substrate having a first conductivity type;

a first linear sequence of a plurality of diffusion regions having a second conductivity type that is opposite the first conductivity type formed in the semiconductor substrate, each diffusion region in the first linear sequence of diffusion regions being spaced-apart from a prior diffusion region in the first linear sequence of diffusion regions to define a substrate channel region therebetween, said substrate channel region having the first conductivity type;

a second linear sequence of a plurality of diffusion regions having the second conductivity type formed in the semiconductor substrate, each diffusion region in the second linear sequence of diffusion regions being spaced-apart from a prior diffusion region in the second linear sequence of diffusion regions to define a substrate channel region therebetween, said substrate channel region having the first conductivity type, the second linear sequence of diffusion regions being formed in parallel with the first linear sequence of diffusion regions but spaced-apart therefrom;

an intermediate region of dielectric material formed in the semiconductor substrate between the first linear sequence of diffusion regions and associated substrate channel regions and the second linear sequence of diffusion regions and associated substrate channel regions to provide electrical isolation between the first linear sequence of diffusion regions and the second linear sequence of diffusion regions, each substrate channel region of the first linear sequence of diffusion regions corresponding to a substrate channel region of the second linear sequence of diffusion regions to define a plurality of substrate channel region pairs;

a conductive gate electrode that includes a plurality of spaced-apart gate electrode fingers, each of the gate electrode fingers being connected to a common gate electrode portion and each of the gate electrode fingers extending over the intermediate region of dielectric material and over an associated substrate channel region pair and separated from said associated substrate channel region pair by intervening gate dielectric material; and wherein the diffusion regions in the first linear sequence of diffusion regions and the diffusion regions in the second linear sequences of diffusion regions are alternately connected to source and drain electrodes, respectively, of the MOSFET transistor structure.

3. A high performance single MOSFET transistor structure comprising:

a semiconductor substrate having a first conductivity type and having an upper surface and lower surface;

a first linear sequence of a plurality of diffusion regions having a second conductivity type that is opposite the first conductivity type formed in the upper surface of the semiconductor substrate, each diffusion region in the first linear sequence of diffusion regions being spaced-apart from a prior diffusion region in the first linear sequence of diffusion regions to define a substrate channel region having the first conductivity type therebetween;

a second linear sequence of a plurality of diffusion regions having the second conductivity type formed in the upper surface of the semiconductor substrate, each diffusion region in the second linear sequence of diffusion regions being spaced-apart from a prior diffusion region in the second linear sequence of diffusion regions to define a substrate channel region having the first conductivity type therebetween;

an intermediate region of dielectric material formed in the semiconductor substrate between the: first linear sequence of diffusion regions and associated substrate channel regions and the second linear sequence of diffusion regions and associated substrate channel regions to provide electrical isolation between the first linear sequence of diffusion regions and the second linear sequence of diffusion regions, each substrate channel region of the first linear sequence of diffusion regions corresponding to a substrate channel region of the second linear sequence of diffusion regions to define a plurality of substrate channel region pairs; and an intermediate conductive gate electrode that includes a plurality of spaced-apart gate electrode fingers, each of the gate electrode fingers being connected to a common gate electrode portion and each of the gate electrode fingers extending over the intermediate region of dielectric material and an associated substrate channel region pair and separated from the associated substrate channel region pair by intervening gate dielectric material; and wherein the diffusion regions in the first linear sequence of diffusion regions and the diffusion regions of the second linear sequence of diffusion regions are alternately connected to source and drain electrodes, respectively, of the single MOSFET transistor structure.

* * * * *

UNITED STATES PATENT AND TRADEMARK OFFICE
CERTIFICATE OF CORRECTION

PATENT NO.    : 6,608,349 B1
DATED         : August 19, 2003
INVENTOR(S)   : Abdalla Naem It is certified that error appears in the above-identified patent and that said Letters Patent is hereby corrected as shown below:

<u>Title page,</u>
Item [75], Inventor, please correct inventor's residence as follows:
-- Overijse (BE) --.

<u>Column 4,</u>
Line 50, the word "therebetween" should be hyphenated as follows:
-- there-between --.

Signed and Sealed this

Twenty-eighth Day of October, 2003

JAMES E. ROGAN
*Director of the United States Patent and Trademark Office*